United States Patent [19]

Cripps et al.

[11] Patent Number: 4,749,959
[45] Date of Patent: Jun. 7, 1988

[54] MULTIPLE FET DEVICE HAVING DIRECT-COUPLED STAGES FOR IMPROVED MICROWAVE OPERATION

[75] Inventors: Stephen C. Cripps; John R. Anderson, both of Sunnyvale; Gary J. Policky, Los Gatos, all of Calif.

[73] Assignee: Celeritek, Inc., San Jose, Calif.

[21] Appl. No.: 933,799

[22] Filed: Nov. 24, 1986

[51] Int. Cl.$^4$ .............................................. H03F 3/193
[52] U.S. Cl. .................................... 330/277; 330/286; 330/306; 330/311
[58] Field of Search ................... 330/53, 56, 277, 286, 330/302, 306, 311, 307

[56] References Cited

U.S. PATENT DOCUMENTS 4,277,764 7/1981 Rosier et al. ................... 330/277 X

OTHER PUBLICATIONS

Glaze et al, "FET Amplifier Spans 4–12 GHz", *Microwave System News*, Feb. 1978, pp. 49–54, 58, 59.
Pengelly, "Transmit/Receive Module using GaAs ICs", *Electronic Engineering*, Nov. 1984, pp. 141–144, 149.

*Primary Examiner*—James B. Mullins
*Attorney, Agent, or Firm*—Flehr, Hohbach, Test, Albritton & Herbert

[57] ABSTRACT

A field effect transistor microwave circuit device includes first and second field effect transistors having common source connections with a pair of coupled transmission lines connecting the drain of a first transistor to the source of the second transistor and the source of the first transistor to the gate of the second transistor. The cross coupled transmission lines function as a balun between the transistors. The device is formed in III–V semiconductor and has an increased operating range in microwave frequencies. In alternative embodiments, the balun is connected to the circuit output thereby permitting the cascading of a plurality of FET devices. The balun can be integrated into the device structure or connected as a discrete element in a hybrid circuit arrangement.

12 Claims, 2 Drawing Sheets

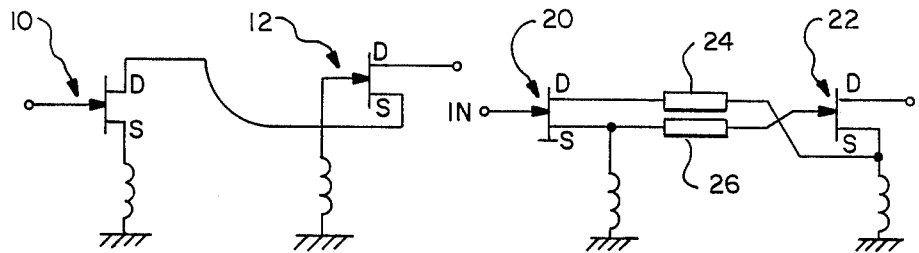
PRIOR ART
FIG.–1
FIG.–2
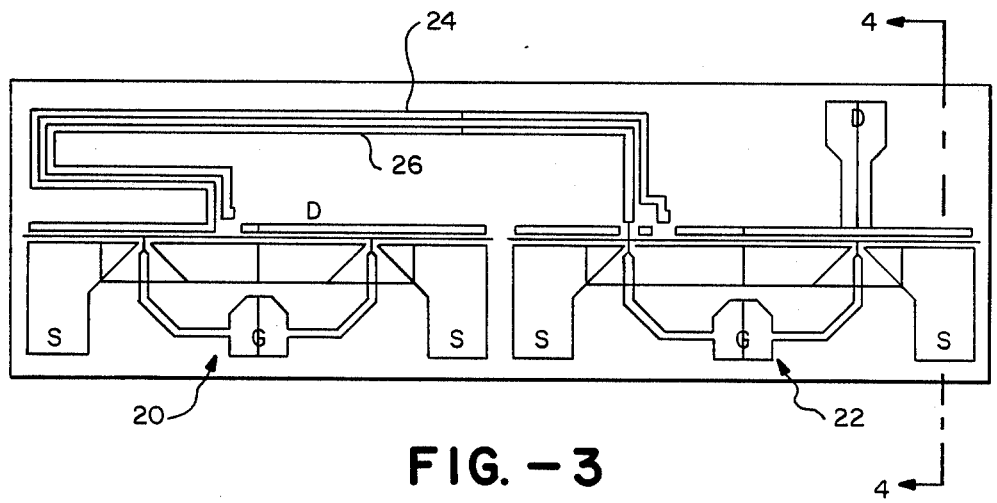
FIG.–3
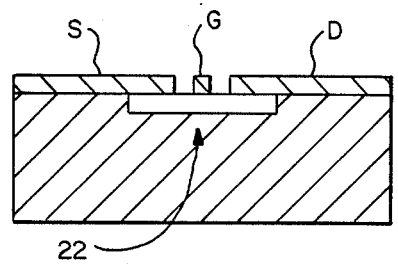
FIG.–4

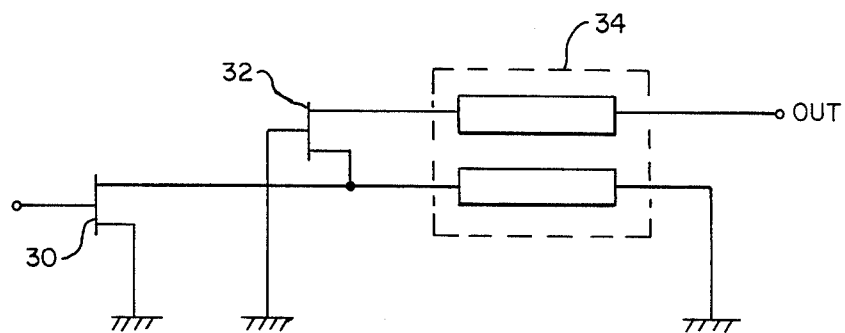
FIG.—5
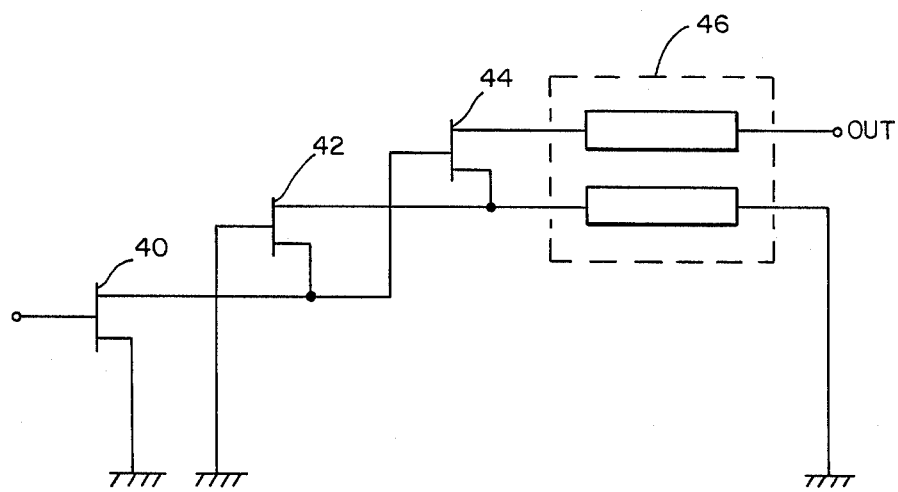
FIG.—6

MULTIPLE FET DEVICE HAVING DIRECT-COUPLED STAGES FOR IMPROVED MICROWAVE OPERATION

This invention relates generally to semiconductor devices, and more particularly the invention relates to a field effect transistor structure having increased gain for microwave operation.

The conventional microwave dual gate FET comprises two gallium arsenide transistors which have an operating range typically in the order of 12-18 gegahertz (GHz). The drain of a first transistor is connected to the source of a second transistor with the gate of the first transistor being the input and the drain of the second transistor being the output. The gate of the second transistor is conductively connected to circuit ground. Heretofore, the common gate causes the second transistor to function as a unity buffer at lower operating frequencies thus limiting the operating range of the device.

In accordance with the present invention a field effect transistor structure is provided having an increased gain in the operating range of from two to eighteen GHz. In one embodiment, two FET's are connected with common sources and with the gate of the first transistor being the input and the drain of the second transistor being the output. Importantly, two coupled transmission lines are provided to connect the drain of the first transistor to the source of the second transistor and to connect the source of the first transistor to the gate of the second transistor. The coupled transmission lines function as a balun which reverses the sense of the RF interconnection in the common source FET's. This embodiment increases the operating bandwidth of the device (i.e. 8-22 GHz).

In another embodiment, the balun is placed at the output of cascaded FET's having common source connections. This embodiment permits increased gain at lower microwave frequencies (i.e. 1-8 GHz).

Accordingly, an object of the invention is a microwave circuitry device having an increased operating range and gain.

A feature of the invention is the use of a balun with cascaded transistors either between stages or at the output.

The invention and objects and features thereof will be more readily apparent from the following detailed description and appended claims when taken with the drawing, in which:

FIG. 1 is a schematic of a dual gate FET structure for microwave applications in accordance with the prior art.

FIG. 2 is a schematic of a dual gate FET structure for microwave applications in accordance with the present invention.

FIG. 3 is a plan view of a semiconductor device structure in accordance with the schematic of FIG. 2.

FIG. 5 is a schematic of two cascaded FET devices with a balun at the output in accordance with another embodiment of the invention.

FIG. 6 is a schematic of three cascaded FET devices with a balun at the outut in accordance with another embodiment of the invention.

Referring now to the drawings, FIG. 1 is a schematic of a dual gate FET structure for microwave applications in accordance with the prior art. The structure includes a first transistor 10 and a second transistor 12 with the drain of transistor 10 connected to the source of transistor 12. The source of transistor 10 is inductively coupled to ground by a wire bond and the gate of transistor 10 functions as the device input. The drian of transistor 12 functions as the device output. The drain of transistor 10 is connected to the source of transistor 12, and the gate of transistor 12 is inductively coupled to circuit ground by a wire bond. As noted above, the conventional device as illustrated in FIG. 1 is limited in operating frequency to about 12-18 gegahertz because the common gate forces transistor 12 to act as a unity buffer at lower frequencies.

In accordance with the present invention, a cascaded FET structure is provided that has an increased operating range and gain by utilizing a balun therein. As illustrated schematically in the embodiment of FIG. 2, first and second FET's 20 and 22 are again provided with the gate of transistor 20 being the input and the drain of transistor 22 being the output. The sources of both transistors are inductively coupled to circut ground by wire bonds. In accordance with a feature of the invention two coupled transmission lines 24 and 26 interconnect the two common source FET's and function as a balun in reversing the RF interconnections of the two transistors. Transmission line 24 connects the drain of transistor 20 to the source of transistor 22, and transmission line 26 connects the source of transistor 20 to the gate of transistor 22. The transmission lines have a length of approximately one-eighth the wavelength of the highest operating frequency. Importantly, transistor 22 does not perform as a unity buffer at the lower operating frequencies thereby extending the gain range of the device.

FIG. 3 is a plan view of a semiconductor device in accordance with the schematic of FIG. 2. Transistor 20 has two source contacts, S, a gate contact, G, and the drain contact, D, which is interconnected by transmission line 24 to the source of transistor 22. Transmission line 26 interconnects the source of transistor 20 and the gate of transistor 22. Transistor 22 also has two source contacts, S, a gate contact, G, and a drain output terminal, D. The structure utilizes conventional semiconductor processing techniques including titanium-tungsten-gold transmission lines, silicon nitride insulation, and etched through holes for interconnecting the transmission lines through the insulation to the active device regions.

FIG. 4 is a section view taken along the line 4—4 of FIG. 3 and further illustrates the source, drain, and gate metalization. The semiconductor body comprises a III, V compound such as semiconducting gallium arsenide, and the active source and drain regions are formed therein by the implantation of silicon ions, for example. Alternatively, the active region of the transistor can be fabricated in a doped epitaxial layer.

FIG. 5 is a schematic of another embodiment of the invention in which two FET transistors 30 and 32 are cascaded and the balun 34 is connected between the source and drain terminals of transistor 32 and the circuit output. The drain of transistor 30 is connected to the source of transistor 32, and the gate of transistor 32 is connected to ground or by-passed through a capacitor so that it can be d.c. biased.

The balun can take a number of forms either integrated in the circuit or connected as a hybrid element. The frequency range and bandwidth of the balun determines the same characteristics of the cascaded transistors. A plurality of transistors can be cascaded as further illustrated in the embodiment of FIG. 6 in which three common source transistors 40,42,44 are interconnected with a balun 46 at the output.

There has been described an improved dual gate field effect transistor circuit structure having an increased operating frequency and gain in the microwave range. While the invention has been described with reference to specific embodiments, the description is illustrative of the invention and is not to be construed as limiting the invention. Various modifications and applicatons may occur to those skilled in the art without departing from the true spirit and scope of the invention as defined by the amended claims.

What is claimed is:

1. A microwave circuit device comprising
   a first field effect transistor having a source, a drain, and a gate,
   a second field effect transistor having a source, a drain, and a gate,
   means for connecting the sources of said first and second transistors to a circuit common potential, and first and second coupled transmission lines, said first transmission line connecting said drain of said first transistor to said source of said second transistor, said second transmission line connecting said source of said first transistor to said gate of said second transistor.

2. The microwave circuit device as defined by claim 1 wherein said device operates over a microwave frequency range, the length of said transmission lines being approximately one-eighth the wavelength of the highest frequency in said operating range.

3. The microwave circuit device as defined by claim 2 wherein said first and second transistors are formed in a group III-V semiconductor body.

4. The microwave circuit device as defined by claim 3 wherein said transmission lines comprise metal layers formed on a surface of said semiconductor body.

5. The microwave circuit device as defined by claim 1 and including an input terminal connected to said gate of said first transistor and an output terminal connected to said drain of said second transistor.

6. A dual gate field effect transistor structure comprising
   a body of gallium arsenide,
   a first field effect transistor formed in said body of gallium arsenide and having a source, a drain, and a gate,
   a second field effect transistor formed in said body of gallium arsenide and having a source, a drain, and a gate, and
   first and second coupled transmission lines, said first transmission line connecting said drain of said first transistor to said source of said second transistor, said second transmission line connecting said source of said first transistor to said gate of said second transistor.

7. The dual gate field effect transistor structure as defined by claim 6 wherein said coupled transmission lines comprise metal layers formed on a surface of said body of gallium arsenide.

8. The dual gate field effect transistor structure as defined by claim 7 and including an input terminal connected to said gate of said first transistor and an output terminal connected to said drain of said second transistor.

9. The dual gate field effect transistor as defined by claim 6 wherein said body of gallium arsenide includes a doped epitaxial layer.

10. A microwave amplifier circuit comprising a plurality of field effect transistors, means connecting said transistors in cascade, and a balun connecting one transistor to a circuit output, said balun comprising first and second coupled transmission lines.

11. The microwave amplifier circuit as defined by claim 10 wherein the source of one transistor is connected to the drain of the other transistor.

12. The microwave amplifier circuit as defined by claim 11 and including an input terminal connected to a gate of one of said transistors, said first and second transmission lines being connected to a source and a drain of another transistor.

* * * * *